US009041006B2

(12) United States Patent
Nakamura et al.

(10) Patent No.: US 9,041,006 B2
(45) Date of Patent: May 26, 2015

(54) SILICON CARBIDE MOS SEMICONDUCTOR DEVICE (75) Inventors: Shun-ichi Nakamura, Matsumoto (JP); Yoshiyuki Yonezawa, Matsumoto (JP); Masahide Gotoh, Matsumoto (JP)

(73) Assignee: FUJI ELECTRIC CO., LTD. (JP)

( * ) Notice: Subject to any disclaimer, the term of this patent is extended or adjusted under 35 U.S.C. 154(b) by 217 days.

(21) Appl. No.: 12/409,964

(22) Filed: Mar. 24, 2009

(65) Prior Publication Data

US 2009/0236612 A1    Sep. 24, 2009

(30) Foreign Application Priority Data

Mar. 24, 2008 (JP) ................................. 2008-075281

(51) Int. Cl.
*H01L 29/15* (2006.01)
*H01L 29/66* (2006.01)
(Continued)

(52) U.S. Cl.
CPC ........ *H01L 29/66068* (2013.01); *H01L 21/046* (2013.01); *H01L 29/0623* (2013.01);
(Continued)

(58) Field of Classification Search
CPC .............. H01L 29/086; H01L 29/6606; H01L 29/66068; H01L 29/7813; H01L 29/8613
USPC ............ 257/77, 256, 328–330, 335, E29.257, 257/E29.26, E29.262
See application file for complete search history.

(56) References Cited

U.S. PATENT DOCUMENTS 7,381,992 B2 * 6/2008 Ryu ................................. 257/77
8,178,920 B2 * 5/2012 Nakamura et al. ............ 257/330
(Continued)

FOREIGN PATENT DOCUMENTS

EP    1 814 162 A1    8/2007
EP    1 873 838 A1    1/2008
(Continued)

OTHER PUBLICATIONS

English machine translation of JP 2006-066439 to Yamashita et al.*
Japanese office action cited in Japanese counterpart application No. JP2008-075281, dated Mar. 5, 2013. English translation provided.

*Primary Examiner* — Laura Menz
*Assistant Examiner* — Candice Y Chan
(74) *Attorney, Agent, or Firm* — Rossi, Kimms & McDowell LLP (57) ABSTRACT A silicon carbide MOS semiconductor device is disclosed which suppresses degradation of efficiency percentage yield with respect to a breakdown voltage even when a surface region with a high impurity concentration is formed by ion implantation with such a high dose as required for attaining a good ohmic contact. The device has a silicon carbide semiconductor substrate, a voltage blocking layer of a first conductivity type formed on the substrate, a body region of a second conductivity type formed on the voltage blocking layer, a body contact region of the second conductivity type formed in a surface region of the body region by selective ion implantation, a surface of the body contact region having such a high impurity concentration as to impart an ohmic contact, a source contact region of the first conductivity type formed in a surface region of the body region by selective ion implantation, a surface of the source contact region having such a high impurity concentration as to impart an ohmic contact, and a source extension region with an impurity concentration lower than that in the source contact region under the source contact region at a region deeper than a tail part of a bottom region of the source contact region by selective ion implantation, the source extension region having an impurity concentration less than $3 \times 10^{19}$ cm$^{-3}$.

9 Claims, 7 Drawing Sheets (51) Int. Cl.
  *H01L 21/04* (2006.01)
  *H01L 29/08* (2006.01)
  *H01L 29/78* (2006.01)
  *H01L 29/861* (2006.01)
  *H01L 29/06* (2006.01)
  *H01L 29/16* (2006.01)
  *H01L 29/423* (2006.01)

(52) U.S. Cl.
  CPC ........... *H01L29/086* (2013.01); *H01L 29/0878* (2013.01); *H01L 29/1608* (2013.01); *H01L 29/4236* (2013.01); *H01L 29/42368* (2013.01); *H01L 29/6606* (2013.01); *H01L 29/7813* (2013.01); *H01L 29/8613* (2013.01)

(56) References Cited

U.S. PATENT DOCUMENTS

| | | |
|---|---|---|
| 2007/0007537 A1 | 1/2007 | Ogura et al. |
| 2007/0187695 A1* | 8/2007 | Nakamura et al. ............... 257/77 |
| 2009/0032821 A1* | 2/2009 | Onose et al. ..................... 257/77 |

FOREIGN PATENT DOCUMENTS

| | | |
|---|---|---|
| JP | 2000-188399 A | 7/2000 |
| JP | 2001-77358 A | 3/2001 |
| JP | 2006-066439 A | 3/2006 |
| JP | 2006-147789 A | 6/2006 |
| JP | 2006-303324 A | 11/2006 |
| JP | 2007-013058 A | 1/2007 |

* cited by examiner

PRIOR ART though the mind could easily miss —

SILICON CARBIDE MOS SEMICONDUCTOR DEVICE

BACKGROUND OF THE INVENTION

A. Field of the Invention

The present invention relates to a MOS semiconductor device using a silicon carbide semiconductor.

B. Description of the Related Art

A high voltage power device fabricated by using a silicon carbide semiconductor (hereinafter occasionally abbreviated to SiC) is expected to exhibit a far reduced on-state-resistance as compared with a power device fabricated using silicon semiconductor (hereinafter occasionally abbreviated to Si). A MOSFET with a breakdown voltage of 1 to 1.2 kV class has exhibited an on-state-resistance of not greater than 5 mΩ cm$^2$. This on-state-resistance value is less than half that of a MOSFET and an IGBT made of Si for the same breakdown voltage class. If developments for cost reduction and performance improvement progress in the future, it can be expected that most of the IGBTs made of Si for parts of an inverter will be replaced by the ones made of SiC.

The reasons for substantial reduction in on-state-resistance by the use of SiC from that of Si are as follows. Since SiC has a high dielectric breakdown electric field, it can impart a reduced thickness of a voltage blocking layer than Si to attain the same breakdown voltage. In addition, since SiC allows a greater amount of impurity to be doped in the voltage blocking layer, it can reduce resistance in the voltage blocking layer by more than two orders of magnitude than Si.

Figure 8:
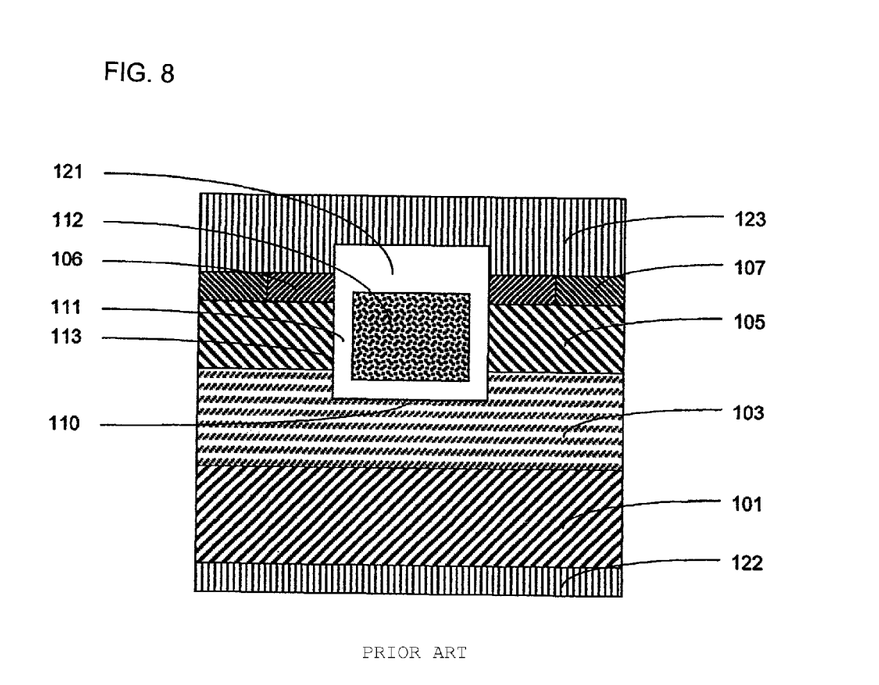
FIG. 8 is a sectional view of an essential part of a common conventional trench MOSFET.

A breakdown voltage in pn junction diodes, MOSFETs, and IGBTs is retained by a pn junction between a voltage blocking layer of a first conductivity type and a body region of a second conductivity type. As an example, FIG. 8 shows a sectional structure of an essential part of a general trench MOSFET. The trench MOSFET comprises voltage blocking layer 103 of a first conductivity type and body region 105 of a second conductivity type formed in this order by epitaxial growth on one principal surface of SiC substrate 101 of the first conductivity type with a low resistivity (high impurity concentration). Source contact region 106 of the first conductivity type with a high impurity concentration by means of selective ion implantation and body contact region 107 of the second conductivity type with a high impurity concentration for imparting good contact quality by means of selective ion implantation are formed in a portion of a surface region of body region 105. Trench 110 is formed from the surface across source contact region 106 and body contact region 105 reaching voltage blocking layer 103. Gate electrode 112 is embedded in the trench via gate insulation film 111 that is formed on the inner surface of trench 110. Source electrode 123 is formed on the surfaces of source contact region 106 and body contact region 107 in ohmic contact with the surfaces. Source electrode 123 is formed continuously covering gate electrode 112. Electrical insulation between source electrode 123 and gate electrode 112 is ensured by interlayer insulation film 121 interposed between the two electrodes. Drain electrode 122 is formed on the other principal surface of SiC substrate 101 in ohmic contact with the substrate. While the above description is made regarding a MOSFET, an IGBT can be basically constructed by only changing SiC substrate 101 in the MOSFET structure to a substrate of the second conductivity type.

Since a channel for current passage is formed in body region 105 in a MOSFET and an IGBT, an amount of impurity doping (impurity concentration) has a more important effect on channel mobility (a carrier mobility in the channel) and threshold voltage of the gate rather than it does on breakdown voltage. An excessively large amount of impurity doping in body region 105 is undesirable because the threshold voltage grows to an unnecessarily high value and the channel mobility significantly decreases. In view of this issue, an amount of doping in body region 105 cannot be very high. On the other hand, an amount of impurity doping (an impurity concentration) in voltage blocking layer 103 is one to two orders of magnitude higher in SiC than in Si at the same design value of a breakdown voltage. As a result, a depletion layer is liable to extend, in SiC in particular, into body region 105 as well as in the voltage blocking layer 103. A channel length in the structure of a MOSFET or an IGBT as shown in FIG. 8 is a length of a thickness of initial body region 105 before ion implantation less the thickness of source contact region 106, which is the thickness of body region 105 between source contact region 106 and voltage blocking layer 103. A shorter channel length is desirable in order to improve current driving capability per unit area. Therefore, design of an amount of impurity doping and a thickness of body region 105 is extremely important in a structure of a trench MOSFET and a trench IGBT made of SiC.

A diffusion coefficient of impurities in SiC is extremely small, which is different from in Si. As a result, a thermal diffusion process for selective doping of impurities in a confined region to be doped, as employed in Si, requires an extraordinarily high temperature and a very long diffusion time. Consequently, the thermal diffusion process is impractical for a fabrication process. Therefore, an ion implantation process is an indispensable technique for performing selective doping in SiC.

Since a band gap is wide in SiC, practically applicable metals create a type of Schottky contact. A good ohmic contact is necessarily accomplished by forming an ion-implanted region with a high impurity concentration in a surface region of SiC and utilizing tunneling current. Ion implantation must be implemented at a high dose to produce a high impurity concentration in the surface region. Source contact region 106 is made to have a high impurity concentration of not smaller than $3 \times 10^{19}$ cm$^{-3}$ at the surface thereof and a thickness of 0.3 μm to 0.4 μm to obtain the ohmic contact in the trench MOSFET illustrated in FIG. 8.

As is well known with silicon, high dose ion implantation causes severe damage (called implantation damage) on crystals. To recover from this implantation damage, a process of activation annealing is needed. Silicon takes a sole crystal structure in conditions within practical temperature and pressure, and exhibits no crystal transformation. Consequently, a region that is transformed to an amorphous state due to heavy implantation damage is restored to the original crystal structure by the activation annealing. The activation annealing in silicon does not thoroughly restore the original structure yet, particularly in a portion slightly deeper than a designed ion implantation depth (the portion is called a tail) because a light damage rather hinders complete recovery, so that crystal defects remain.

Stating again, the implantation damage caused by low dose ion implantation can be recovered to a practically negligible level by the activation annealing. The low dose implantation, however, does not attain a satisfactory ohmic contact with a metal electrode, increasing an on-state-resistance. Therefore, an ion implantation process at a high dose rate is indispensable.

SiC exhibits a variety of transformations of crystal structures (called "polytype" of SiC, in particular), which causes more complicated problems. It is known, for example, that hexagonal SiC of 4H—SiC and 6H—SiC, types of transformed crystal structures, exhibits higher dielectric breakdown electric field than a cubic SiC of 3C-SiC. However, the hexagonal SiC, when subjected to high dose ion implantation, partially generates the cubic SiC in the process of activation annealing, which inevitably entails a problem of creating crystal defects around the cubic SiC. This problem is known to be controlled by using, for example a {1120} plane, which is perpendicular to a commonly used {0001} plane, in place of the {0001} plane. However, the hexagonal SiC exhibits an especially high dielectric breakdown electric field in a <0001> direction (a dielectric breakdown electric field in a <1120> direction for example, is said to be only 70 to 75% of the one in a <0001> direction). Thus, use of the {1120} plane is disadvantageous in view of tradeoff between a breakdown voltage and an on-state-resistance.

For the SiC consequently, even when a high dose ion implantation is unavoidable to attain a good ohmic contact, a process is commonly employed that alleviates implantation damage to the minimum, for example, an ion implantation process conducted with a wafer held at a high temperature of about 500° C. Unfortunately, such a process still leaves the unavoidable implantation damage in the tail part. No clear knowledge has been acquired heretofore concerning adverse effects of this implantation damage on semiconductor characteristics.

The following documents relate to the above-described conventional technologies. Japanese Unexamined Patent Application Publication No. 2006-303324 discloses a SiC semiconductor device exhibiting an effectively reduced on-state-resistance, by forming an $n^+$-type source layer by ion implantation in a p-type well and a second n-type diffusion layer partially overlapping this source layer to suppress influence of mask misalignment on the on-state-resistance. Japanese Unexamined Patent Application Publication No. 2001-077358 discloses a structure comprising an n-type region on side faces and bottom face of a trench in a trench type SiC MOS semiconductor device. Japanese Unexamined Patent Application Publication No. 2006-147789 discloses a structure comprising an n-region under an n-type source region via a p-region in a silicon carbide MOS field effect transistor.

Since no clear knowledge has been acquired yet concerning adverse effects of the implantation damage induced at the tail part upon ion implantation into a SiC wafer on semiconductor characteristics as describe above, a MOS semiconductor device made of SiC according to a device design based on the conventional knowledge presents a problem that a depletion layer comes in contact with the tail part on application of an off-voltage lowering the breakdown voltage.

The inventors of the present invention have studied the effects of the implantation damage induced in the tail part by ion implantation into SiC on semiconductor characteristics, and found that efficiency percentage, a rate of non-defective products with respect to a breakdown voltage, is substantially affected by an ion implantation process with such a high dose as required for attaining an ordinarily good ohmic contact.

The present invention is directed to overcoming or at least reducing the effects of one or more of the problems set forth above.

SUMMARY OF THE INVENTION

The present invention has been accomplished based on this finding and provides a silicon carbide MOS semiconductor device suppressing degradation of efficiency percentage with respect to a breakdown voltage even when a surface region with a high impurity concentration is formed by ion implantation in such a high dose as required for attaining a good ohmic contact.

A silicon carbide MOS semiconductor device according to the present invention comprises a silicon carbide semiconductor substrate, a voltage blocking layer of a first conductivity type formed on the substrate, a body region of a second conductivity type formed on the voltage blocking layer, a body contact region of the second conductivity type formed in a surface region of the body region by selective ion implantation, a surface of the body contact region having such a high impurity concentration as to impart an ohmic contact, a source contact region of the first conductivity type formed in a surface region of the body region by selective ion implantation, a surface of the source contact region having such a high impurity concentration as to impart an ohmic contact, a source extension region with an impurity concentration lower than that in the source contact region formed under the source contact region at a region deeper than a tail part of a bottom region of the source contact region by selective ion implantation, the source extension region having an impurity concentration less than $3 \times 10^{19}$ cm$^{-3}$.

Preferably in a silicon carbide MOS semiconductor device of the invention, an impurity concentration and a thickness of the body contact region are determined so that a depletion layer extending from an interface between the voltage blocking layer and the body region at a time of application of a reverse bias voltage on a pn junction between the voltage blocking layer and the body region, reaches an avalanche breakdown voltage before the depletion layer comes in contact with a defect region generated by implantation damage in the tail part at the bottom region of the body contact region, or so that the depletion layer undergoes punch-through by touching the source extension region.

Preferably, silicon carbide MOS semiconductor device of the invention has a trench gate structure.

The invention has a profound effect by using a hexagonal SiC, and in particular using a plane of approximately {0001} plane of hexagonal SiC. The use of hexagonal SiC particularly the use of a plane of approximately {0001} plane exhibits a high dielectric breakdown electric field and consequently elongates a depletion layer extending to the body region. Therefore, a phenomenon of degradation in the yield (efficiency percentage) with respect to the breakdown voltage hardly affects the device even when ion implantation is implemented at such a high dose as that required in forming a surface region with a high impurity concentration for attaining a good ohmic contact. Thus, the use of hexagonal SiC is preferable for this advantage.

The "approximately {0001} plane" is defined as follows. A type of wafer is on the market is known as a {0001} plane wafer. This type of wafer has a principal plane with several degrees off from the {0001} plane, more specifically in the range of 3.5 to 8 degrees off, for the purpose of obtaining a good epitaxial growth layer. The approximately {0001} plane referred to in the present invention is to be understood to include a plane with an off angle such as this.

In the process of forming a source contact region with a high impurity concentration by ion implantation, a source extension region must be formed to a depth definitely deeper than a tail part that is naturally formed under the source contact region. Deeper implantation using ions of a large projection range generally entails larger dispersion of distribution of the ions in the depth direction at each acceleration voltage, thus causing difficulty in design work. For example, formation of a body region in a trench MOSFET by epitaxial growth liable to be affected by distribution of the doping in the wafer surface, resulting in variation in a channel length, that is, a length remaining in the second conductivity type. Therefore, a process of deep ion implantation is preferably conducted by using a type of ions exhibiting a small parallel dispersion (dispersion in the direction of ion implantation).

Figure 4:
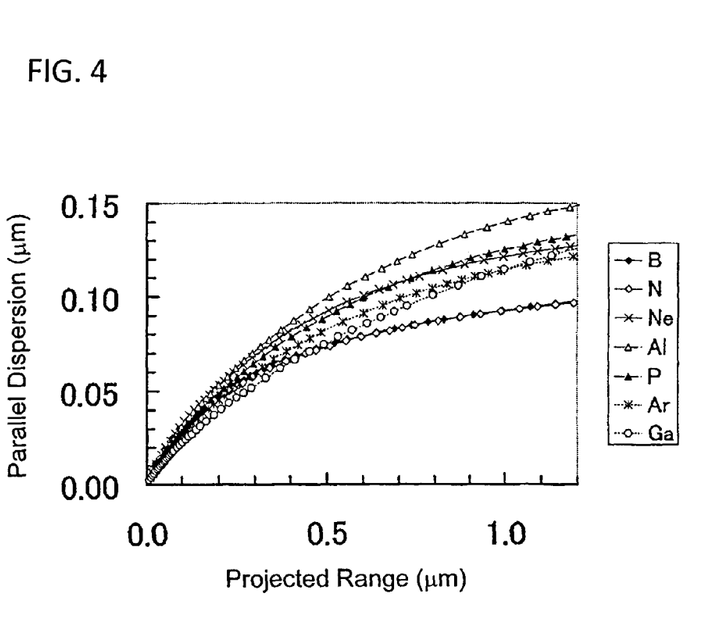
FIG. 4 shows a relationship between a projected range and a parallel dispersion for various kinds of ions in ion implantation.

FIG. 4 shows projected ranges of various types of ions in ion implantation and a degree of parallel dispersion. While a difference in the parallel dispersion caused by a difference in the types of ions is insignificant until the projected range increases to about 0.2 µm, the difference becomes significant from the projected range of 0.3 µm to 0.5 µm. As shown in FIG. 4, aluminum exhibits the greatest parallel dispersion, since aluminum (mass number 27) has the nearest mass to silicon (mass number 28), silicon being the heaviest element among the components in SiC. This results in an extreme change of an orbit due to elastic collision.

Elements in the figure having a smaller mass than silicon are neon (mass number 20), nitrogen (mass number 14), and boron (mass number 11). The parallel dispersion decreases in this order. More accurately, the parallel dispersion saturates to the same level (around the values of nitrogen and boron) with the mass numbers of 18 (an isotope of oxygen) and smaller. This phenomenon can be attributed to less change in the orbit upon the elastic collision along with decrease in the mass when the mass is less than that of silicon.

Elements having a mass number larger than that of silicon are phosphorus (mass number 31), argon (mass number about 40), and gallium (mass number about 69). The parallel dispersion decreases with increase of the mass number. This can be attributed to the fact that an element having a larger mass number, which is greater than that of silicon, undergoes less change in the orbit upon elastic collision.

It is desired in application to a trench MOSFET for the source extension region to have a certain degree of depth, for example, about 1 µm, in order to ensure a margin for fabricating an embedded gate electrode. In order to envisage reduction in the parallel dispersion of ions, it is preferable to use ions with a small mass ratio to silicon, where the mass ratio is defined by (a mass of an implanting ion/a mass of a silicon atom) for an ion with a smaller mass than silicon, and (a mass of a silicon atom/a mass of an implanting ion) for an ion with a larger mass than silicon. Since elements having a mass (or an atomic radius) very different from that of silicon generally exhibit a narrow range of a doping amount that enables a donor or acceptor function, so as to cause difficulty in attaining a high impurity concentration, the source contact region is preferably formed using an element having a mass near that of silicon. Thus, it is preferable to use a type of ion having a large mass ratio to silicon, for example phosphorus, for the source contact region, and a type of ion having a small mass ratio to silicon for the source extension region.

It is more favorable to implant a type of ions having a mass number of 18 or less, for example nitrogen, for the source extension region, if possible, because the parallel dispersion can be minimized.

To achieve the above-mentioned combination, it is therefore preferable in the case of the first conductivity type of n-type, to employ phosphorus for the source contact region and nitrogen for the source extension region.

In the case of the first conductivity type of p-type, it is preferable to employ aluminum for the source contact region, and boron for the source extension region.

The present invention provides a silicon carbide MOS semiconductor device suppressing degradation of efficiency percentage with respect to a breakdown voltage even when a surface region with a high impurity concentration is formed by ion implantation in such a high dose as required for attaining a good ohmic contact.

BRIEF DESCRIPTION OF THE DRAWINGS

The foregoing advantages and features of the invention will become apparent upon reference to the following detailed description and the accompanying drawings, of which.

DETAILED DESCRIPTION OF SPECIFIC EMBODIMENTS

A silicon carbide MOS semiconductor device according to the invention will be described in detail below with reference to the accompanying drawings. The invention is not limited to the embodiments described below within the spirit and scope of the invention.

Figure 1:
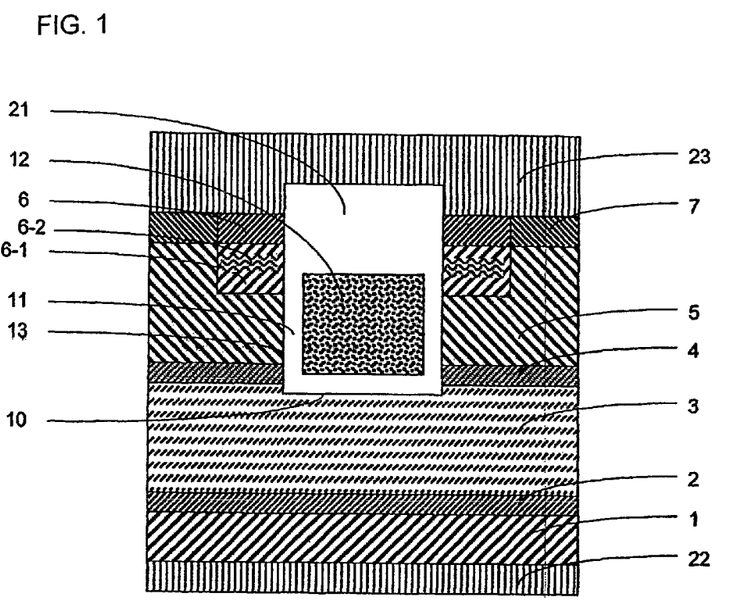
FIG. 1 is a sectional view of an essential part of a trench MOSFET according to a first embodiment of the invention.
Figure 2:
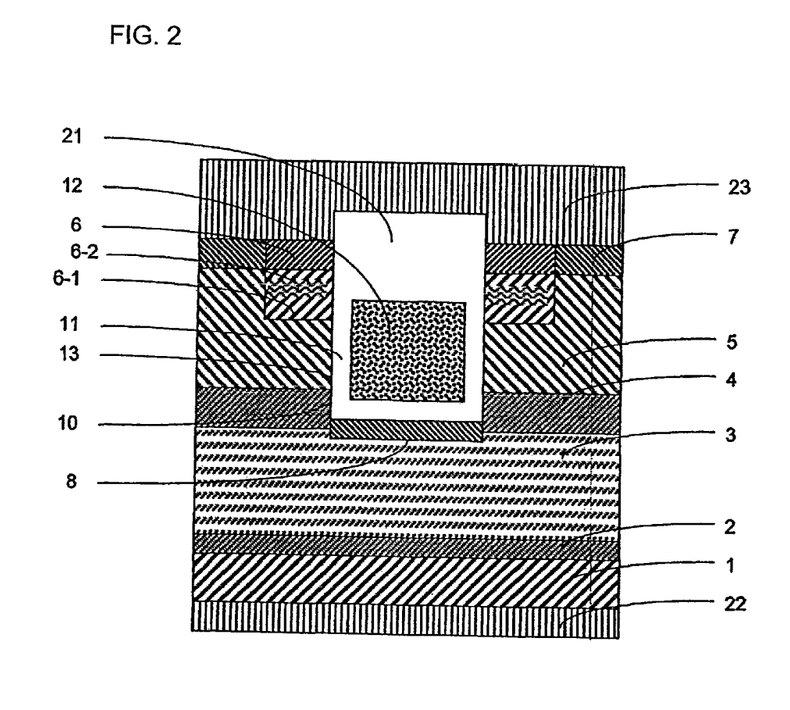
FIG. 2 is a sectional view of an essential part of a modified trench MOSFET according to a first embodiment of the invention.
Figure 3:
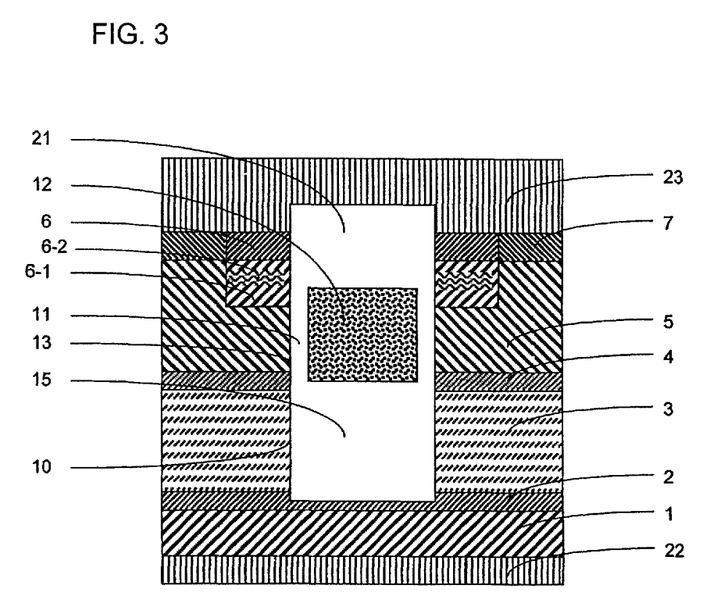
FIG. 3 is a sectional view of an essential part of another modified trench MOSFET according to a first embodiment of the invention.
Figure 5:
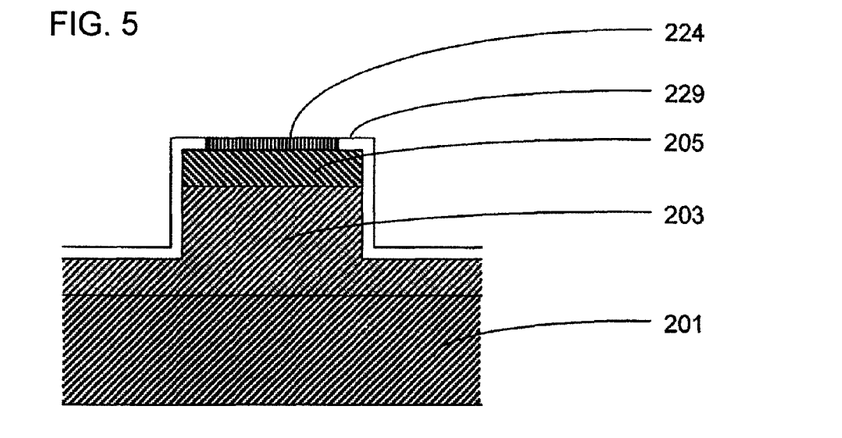
FIG. 5 is a sectional view of an essential part of a pn junction diode fabricated in a preliminary experiment according to the invention.
Figure 6:
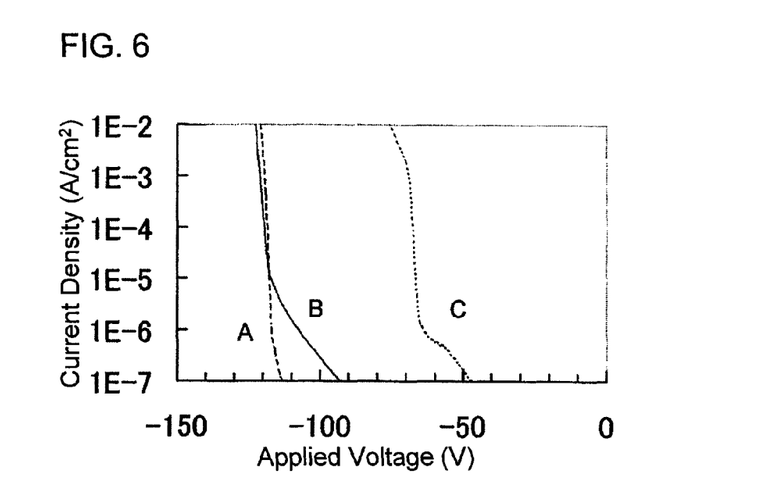
FIG. 6 is a graph showing current-voltage characteristics in a reversed direction of a pn junction diode fabricated in a preliminary experiment according to the invention.
Figure 7:
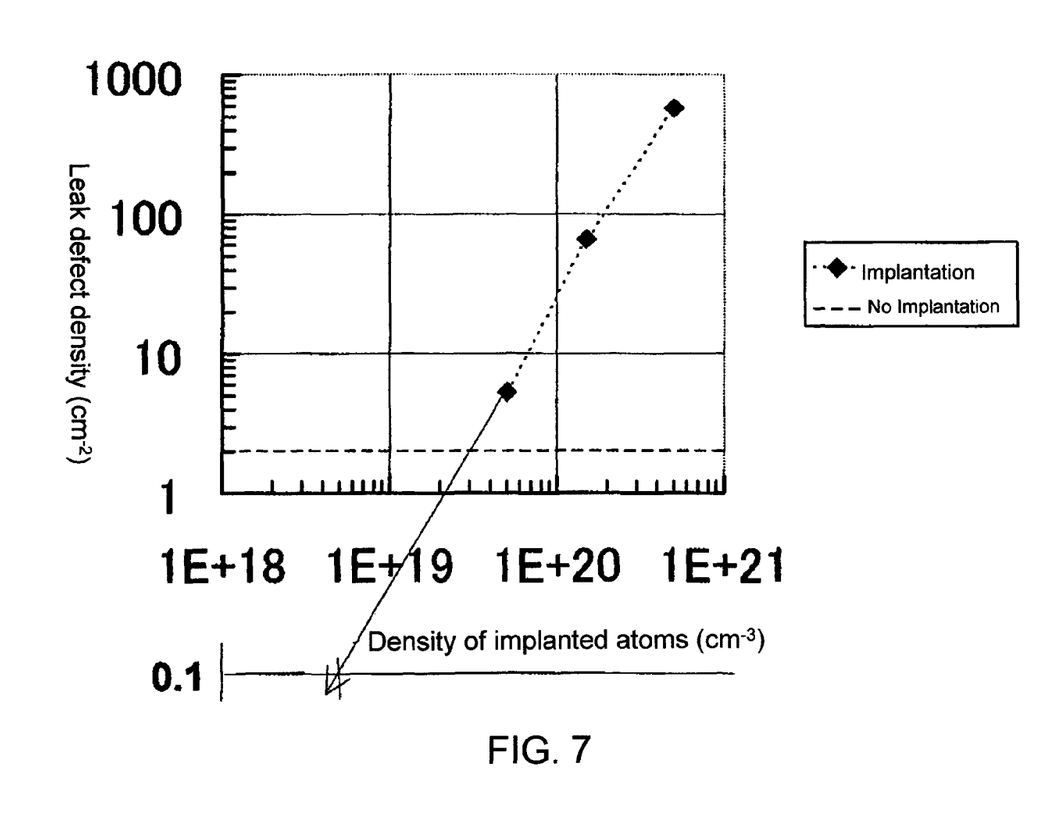
FIG. 7 is a graph showing a relationship between a concentration of implanted atoms and a leak defect density obtained in the preliminary experiment according to the invention.

FIGS. 1 through 3 are sectional views of essential parts of different trench MOSFETs according to a first embodiment of the invention. FIG. 4 shows a relationship between a projected range and a parallel dispersion of various ions in ion implantation. FIG. 5 is a sectional view of an essential part of a pn junction diode fabricated in a preliminary experiment. FIG. 6 is a graph showing reverse current-voltage characteristics of a pn junction diode fabricated in the preliminary experiment. FIG. 7 is a graph showing a relationship between a concentration of implanted atoms and a leak defect density obtained in the preliminary experiment.

The following experiments have been performed by the inventors in order to acquire knowledge about effects on semiconductor characteristics caused by the implantation damage in the tail part created at the bottom region of the implanted region when high dose ion implantation is implemented into the SiC epitaxial layer. A SiC pn junction diode having a sectional structure of an essential part as shown in FIG. 5 was fabricated. N-type voltage blocking layer (a drift layer) 203 and a body layer that is a p-type layer (an anode layer) were sequentially grown by epitaxial growth on one principal surface (referred to as a front surface) of n-type SiC substrate 201 with a high impurity concentration. Although the fabricated device was a pn junction diode, a nomination is used here similarly for a MOSFET calling the p-type layer (an anode layer) as a body layer, for example. Hereinafter, a substrate at this stage is referred to as a wafer. The body layer and voltage blocking layer 203 of the wafer were etched from the front surface to form a mesa structure. The body layer after forming the mesa structure is called body region 205 as shown in FIG. 5. An amount of doping (an impurity concentration) into voltage blocking layer 203 and a depth of the mesa structure were adjusted so that a depletion layer extending from a pn junction at the interface between body region 205 and voltage blocking layer 203 did not expand deeply beyond the position of the bottom of the mesa even upon application of a voltage reaching the avalanche breakdown voltage. After heating up to 500° C., for example, a part of the pn junction diode in the wafer was subjected to selective ion implantation on the surface region of body region 205 to form a body contact region (not shown in FIG. 5) of a high impurity concentration p-type. Then, surface protection film 229 such as a $SiO_2$ film was formed on the all pn junction diodes. In a part of surface protection film 229, a contact hole was formed and anode electrode 224 was formed there.

More specifically, an amount of doping (an impurity concentration) in voltage blocking layer 203 was $5 \times 10^{17}$ $cm^{-3}$, for example. Body region 205 was doped in an amount of $3 \times 10^{18}$ $cm^{-3}$ and had a thickness of about 0.7 μm. The avalanche breakdown voltage in this case was about 120 V, at which a depletion layer extends to a distance slightly less than 0.1 μm into body region 205. The body contact region was imparted a box profile in which the density of implanted atoms was approximately constant within a depth of 0.4 μm. Due to the parallel dispersion described previously, the ion-implanted atoms were distributed to a depth of about 0.5 μm.

The thus-completed pn junction diode was measured for reverse current-voltage characteristics, a result of which is given in FIG. 6 showing three typical characteristic waveforms of A, B, and C. In FIG. 6, the abscissa represents an applied voltage and the ordinate represents a current density that is an electric current value divided by a device area. The letters such as 1E-2 indicated at the ordinate means $1 \times 10^{-2}$, other similar letters have the similar meaning.

The characteristic of the waveform A in FIG. 6, in which an electric current in the reversed direction is less than a noise level at voltages up to the avalanche breakdown voltage, is intrinsically expected for a pn junction diode. Nevertheless, this type of characteristic was observed solely in a pn junction diode lacking the body contact region with a surface region of high impurity concentration. The characteristic of the waveform B in FIG. 6, in which an avalanche breakdown voltage is eventually reached while a reverse current begins to flow at a certain voltage, can be acceptable in many cases as far as this type of characteristic is exhibited stably. The waveform A and the waveform B cross each other in FIG. 6. This phenomenon is caused by variation in doping into voltage blocking layer 203, and is not essential. The characteristic of the waveform C in FIG. 6, in which a large reverse current flows before a voltage reaches the avalanche breakdown voltage, was observed in a pn junction diode having a body contact region with a surface region of high impurity concentration. A device exhibiting this waveform C does not attain the desired breakdown voltage anymore, and is thus unacceptable.

Accordingly, the relationship was studied between a yield of obtaining the characteristic A or B in FIG. 6 and a device area, with a parameter of the density of atoms implanted into the body contact region. From this relationship, a defect density that induces the characteristic C was obtained (the defect density is especially referred to as a leak defect density), and the result is given in FIG. 7. In FIG. 7, the ordinate represents the leak defect density ($cm^{-2}$) and the abscissa represents the density of implanted atoms ($cm^{-3}$) (the implanted atoms here were aluminum). FIG. 7 shows that the leak defect density is approximately proportional to the square of the density of implanted atoms (an impurity concentration of aluminum).

This result reveals that the leak defects are not simply generated through a stochastic process in the implantation of individual atoms. The reason is that such a simple mechanism would result in a directly proportional relation between the leak defect density and the density of implanted atoms.

Since the leak defects are generated at a relatively low density of implanted atoms in the order of $10^{19}$ $cm^{-3}$ as shown in FIG. 7, it is hardly conceivable that the leak defects are generated through interactions between the implanted atoms. This is because the concentration of the implanted atoms is three to four orders of magnitude smaller than that of the matrix of SiC crystals, which is about $10^{23}$ $cm^{-3}$. Provided that the leak defects are not induced by the interaction between implanted atoms, it is scarcely perceived that a generation probability of the leak defects significantly varies depending on the chemical property of the implanted atoms.

A phenomenon peculiar to SiC is a high probability in the existence of leak defects still remaining after activation annealing. A physical model can be imagined that the ion implantation generates vacancies and interstitial atoms proportional to the concentration of implanted atoms, and these lattice defects recombine, releasing a certain amount of superfluous energy, which in turn induces, of a certain probability, the slip of atomic planes that is especially significant in SiC. The slip of atomic planes cannot be recovered by activation annealing, and induces the leak defects. This model accounts for the relation that the density of leak defects is proportional to the square of the concentration of implanted atoms, and further, is a phenomenon peculiar to SiC.

In order to clarify the true mechanism of generating the leak defects, a massive amount of purely scientific approach is needed, which is impractical in view of profitability. Accordingly, as an engineering guideline in actual design of a power device, it is appropriate to determine a permissible concentration of ion implanted atoms bearing aluminum in mind, the aluminum exhibiting large parallel dispersion as described previously and being supposed to be the worst case. Since the leak defect density is proportional to the square of the concentration of the implanted atoms, the leak defect density rapidly decreases below a certain predetermined concentration of implanting atoms. Therefore, it is of significant value to set up the predetermined concentration of implanting atoms.

A leak defect density of about 2/$cm^2$ was found for the density value caused by external factors other than ion implantation, the leak defect density being obtained from the yield of SiC pn junction diodes without the body contact region, as described previously. In FIG. 7, the dotted line indicating a constant density of leak defects of 2/$cm^2$ shows the leak defect density caused by factors other than ion implantation. Extrapolating the obtained data in FIG. 7, it can be seen that a leak defect density induced by ion implantation decreases below the leak defect density caused by external factors other than ion implantation (2/$cm^2$) when a concentration of implanted atoms is less than about $3 \times 10^{19}$ $cm^{-3}$ in the manufacturing technology of the inventors at present. Therefore, a concentration of implanted atoms of less than about $3 \times 10^{19}$ $cm^{-3}$ has practically no problem of leak defects.

However, power devices that handle a heavy current over 10 A need an area of 3 mm square or larger, and moreover, are expected to exhibit a high yield of more than 95%. As a result, an acceptable defect density is less than about 0.1/$cm^2$. In order to attain a leak defect density induced by ion implantation of about 0.1/$cm^2$ or less, extrapolating the data obtained in FIG. 7, a concentration of implanted atoms must be decreased to about $5\times10^{18}$ cm$^{-3}$ or lower.

In SiC, in a p-type SiC in particular, the low doping quantity (impurity concentration) as indicated above, while imparting a low leak defect density and a high efficiency percentage with respect to withstand voltage, hardly attains a satisfactory ohmic contact. In the experiments by the inventors, an ohmic contact was not obtained in an amount of aluminum doping less than $3\times10^{19}$ cm$^{-3}$.

Therefore, a device structure according to the present invention is essential in order to avoid an adverse effect of the phenomenon generating leak defects caused by ion implantation on the one hand and to ensure forming a p-type region with such a high impurity concentration as to achieve a good ohmic contact by means of ion implantation on the other hand. Some specific examples of the device structure will be described in detail below with reference to some preferred embodiments.

Embodiment 1

Embodiment 1 according to the invention is a so-called trench MOSFET. FIG. 1 shows a sectional structure of an essential part of the trench MOSFET. The device of Embodiment 1 comprises SiC substrate 1 composed of a high impurity concentration n-type 4H-SiC having a principal plane (a front surface) of (0001)c 8 degrees off plane. On the front surface of the SiC substrate the following are sequentially formed: field stopping layer 2 of a high impurity concentration n-type, drift layer 3 of a low impurity concentration n-type, current spreading layer 4 of the n-type, and body region 5 of a p-type, the layers being formed over the whole surface by means of epitaxial growth, for example. On a portion of a surface region of body region 5, a lower layer of source extension region 6-1 of a high impurity concentration n-type and an upper layer of source contact region 6 of a higher impurity concentration n-type are formed. The "high impurity concentration" in the source extension region 6-1 is preferably a doping quantity smaller than $3\times10^{19}$ cm$^{-3}$, more preferably not larger than $5\times10^{18}$ cm$^{-3}$. A depth of the source extension region 6-1 is within 1 μm from the surface thereof. The upper layer of source contact region 6 has an impurity concentration of $3\times10^{19}$ cm$^{-3}$ or higher and a thickness of from 0.3 μm to 0.4 μm.

Trench 10 is formed from a surface of source contact region 6 piecing through source contact region 6, the lower layer of source extension region 6-1, body region 5 and current spreading layer 4, and reaching drift layer 3. In the resulting trench 10, gate electrode 12 is embedded via gate oxide 11 on a portion of an inner wall of the trench at locations adjacent to body region 5, source extension region 6 in the vicinity of body region 5, and current spreading layer 4. Channel 13 is formed in a surface region in contact with gate oxide 11 in a portion of body region 5 intervening between source extension region 6-1 and current spreading layer 4, channel 13 serving a passage of a main current, which can be controlled by gate electrode 12. Interlayer insulator 21 is formed in a portion of trench 10 over gate electrode 12 and at a location of a part of the surface region of source contact region 6, forming a cover of trench 10. Other parts of the surface of source contact region 6 are in contact with source electrode 23. Source electrode 23 covers and spans interlayer insulator 21 and is connected to a surface of source contact region 6 of an adjacent cell. A portion of source electrode 23 is in contact commonly with a surface of body contact region 7 of a high impurity concentration p-type formed on the surface of body region 5. On the back surface of SiC substrate 1, drain electrode 22 is provided.

It should be noted that despite the illustration in FIG. 1 and the description above, field stopping layer 2 and current spreading layer 4, although providing certain advantages, are not essential for the present invention in its broadest aspect and therefore may be omitted. The front surface of SiC substrate 1 does not need to be a (0001)c 8 degrees off plane, but may be a plane with a smaller off-angle of 4 degrees off, for example, as long as it provides a good epitaxial layer. Use of a plane other than the approximately (0001)c plane is not precluded in the invention. The use of the approximately (0001)c plane is preferable however, because the channel resistance (a resistance along the current path in channel 13) varies little when an angle of the side walls of trench 10 varies against the principal surface.

In FIG. 1, the thickness of body contact region 7 is depicted as nearly equal to the thickness of source contact region 6. A resistance of a portion of body region 5 located between source extension regions 6-1 of adjacent cells may increase during formation of source extension region 6-1 by ion implantation, causing instability of the electric potential in body region 5. Accordingly, it is favorable to implant ions of aluminum or boron into the region under body contact region 7 so that source extension region 6-1 and tail part 6-2 in the region under body contact region 7 are nearly equal in their depth if permissible, in order to reduce the resistance of the region of this body region 5. When nitrogen is implanted into source extension region 6-1, boron is preferably used for ion implantation into the region under body contact region 7 since the parallel dispersions of the two types of ions are nearly the same and the design is simplified. An amount of doping of aluminum or boron into the region under body contact region 7 is again preferably less than $3\times10^{19}$ cm$^{-3}$, more preferably not greater than $5\times10^{18}$ cm$^{-3}$. In the case of boron in particular, the doping quantity needs to be not greater than $5\times10^{18}$ cm$^{-3}$ since segregation occurs for an impurity concentration greater than $5\times10^{18}$ cm$^{-3}$.

A thickness and a doping quantity (an impurity concentration) of the regions and layers are to be properly determined according to the required electric performance. For a breakdown voltage of 1.2 kV, for example, field stopping layer 2 has a donor concentration of $0.5\times10^{17}$ cm$^{-3}$ to $10\times10^{17}$ cm$^{-3}$ and a thickness of about 2 μm, drift layer 3 has a donor concentration of $1\times10^{16}$ cm$^{-3}$ and a thickness of 13 μm, current spreading layer 4 has a donor concentration of $1\times10^{17}$ cm$^{-3}$ and a thickness of 0.4 μm, p-type body region 5 has an acceptor concentration of $2\times10^{17}$ cm$^{-3}$ and a thickness of 2.3 μm (which is a depth from the surface to the bottom of body region 5).

With these design parameters, a depletion layer does not come in contact with tail part 6-2 formed beneath source contact region 6 and body contact region 7, even at the avalanche breakdown voltage. With inaccuracy occurring in the manufacturing process, a depletion layer may come in contact with source extension region 6-1 to induce a punch-through. However, no leak defect is practically generated in tail part 6-2 because of the small amount of doping in source extension region 6-1, and the punch-through occurs at a voltage within forecastable bounds corresponding to the inaccuracy occurring in the manufacturing process.

A cell pitch and a width of the trench are determined depending on parameters including accuracy and precision in the manufacturing process and can be, for example, 8 μm for a cell pitch and 1 μm for a trench width. Field stopping layer 2 and current spreading layer 4 can be eliminated. Since quality of SiC substrate 1 is not always satisfactory, a depletion layer may expands throughout drift layer 3 upon application of a reverse voltage. In that case yet, the existence of field stopping layer 2 prevents the high electric field at the front of the depletion layer from being exerted on SiC substrate 1, inhibiting dielectric breakdown due to low quality of the substrate.

In a case lacking field stopping layer 2, a word "field stopping layer" in the following description is to be understood as an upper region of SiC substrate 1. Since drift layer 3 has a relatively high resistivity, an electric current running in channel 13 at the interface between body region 5 and gate insulator 11, the interface being the side wall of trench 10, may flow only in a region of drift layer 3 in the vicinity of trench 10, increasing the on-state-resistance due to the concentration of electric current. If current spreading layer 4 is provided, the current flows spreading over a broad area in drift layer 3, suppressing the increase of on-state-resistance due to the current concentration. In the case lacking current spreading layer 4, the phrase "a current spreading layer 4" in the following description is to be understood as a top region of drift layer 3.

While only a single gate electrode 12 is depicted in FIG. 1, practical devices have much greater number of unit cell structures repeated in a device. In addition, in a practical device, gate electrode 12 has an appropriate end structure formed at an end portion thereof.

The end structure can be formed by an appropriate method and a detailed description thereon is omitted. When an end structure is formed by ion implantation and a p-type region is in contact with the body region 5, the part is preferably doped in a concentration less than $3 \times 10^{19}$ cm$^{-3}$, more preferably not larger than $5 \times 10^{18}$ cm$^{-3}$.

In a practical application of the device having a structure as depicted in FIG. 1, a phenomenon is known in which an excessively strong electric field is exerted on insulator 11 at the bottom of trench 10. This phenomenon tends to cause dielectric breakdown and is regarded as a problem. The bottom of the trench consequently must be properly protected to avoid the dielectric breakdown. One of the well known measures is provision of embedded p-type region 8 at the bottom of trench 10 as shown in FIG. 2. The structure, however, generates a region similar to a JFET region in a DMOSFET around embedded p-type region 8. Thus, this structure creates a new problem that the JFET effect increases the resistance and raises a loss accompanying current flow.

To cope with this problem, a structure as shown in FIG. 3 is known in which trench 10 is expanded at least to a depth to reach field stopping layer 2 under drift layer 3 and insulator 15 is embedded under gate electrode 12. This embedded insulator structure does not generate a JFET region, and based on a law of electromagnetics, an electric field exerted on embedded insulator 15 is in the same level as in drift layer 3. Therefore, there is little fear of causing dielectric breakdown of embedded insulator 15 due to an extraordinary large electric field.

A simple description is made in the following on a method for manufacturing a trench MOSFET having the embedded insulator structure. Sequentially formed on SiC substrate 1 by epitaxial SiC growth are: field stopping layer 2, drift layer 3, current spreading layer 4, and body region 5. After that, using an appropriately patterned mask material for example SiO$_2$ film as a mask, a surface of the epitaxial SiC layer is etched to a depth of about 1 μm and provides a marker for mask alignment (not shown in FIGS. 1 through 3). Then, the SiO$_2$ film no longer needed is removed. Then, like in the previous process, using an appropriately patterned mask material for example, a SiO$_2$ film as a mask, aluminum ions are implanted into a wafer heated up to 500° C. to a predetermined profile, to form body contact region 7. (An ion implantation at room temperature is not precluded in the invention.) In order to achieve a good ohmic contact, the implantation of aluminum ions is conducted in a high impurity concentration, for example, of the order of $10^{20}$ cm$^{-3}$. After removing the mask, the wafer is heated to 1,700° C. in an atmosphere of a mixture of argon and silane (SiH$_4$) to activate the implanted aluminum ions (a process called activation annealing). This activation annealing may be conducted after each ion implantation process with a respective pattern and profile, or after completion of all the ion implantation processes. When a screen oxidation is employed as in a silicon process, the activation annealing is preferably conducted after each ion implantation process separately to avoid disappearance of the ion implanted layers due to accelerated oxidation.

Subsequently, ion implantation is implemented using a mask of an appropriately patterned mask material for example, SiO$_2$ film, to form source contact region 6 and source expansion region 6-1. The ion implantation for source contact region 6 is implemented with phosphorus in a high impurity concentration, for example, in the order of $10^{20}$ cm$^{-3}$ in order to achieve a good ohmic contact. Source extension region 6-1, on the other hand, only needs to be a low resistivity n-type. An impurity concentration less than $3 \times 10^{19}$ cm$^{-3}$ is preferable to avoid the generation of a fatal amount of leak defects inducing lowering of the breakdown voltage due to ion implantation as described in FIG. 6 and FIG. 7. Therefore, a doping amount in source extension region 6-1 is preferably less than $3 \times 10^{19}$ cm$^{-3}$, more preferably not larger than $5 \times 10^{18}$ cm$^{-3}$. Nitrogen is preferably used because of its small parallel dispersion. Use of phosphorus as in source contact region 6 is nevertheless not precluded. Doping of nitrogen more than about $2 \times 10^{19}$ cm$^{-3}$ lowers the activation ratio for the nitrogen ions exceeding this doping value. Consequently, for forming a high impurity concentration n-type region such as source contact region 6, the use of phosphorus is favorable. Source extension region 6-1 should be thick enough so that the top of gate electrode 12 is higher than the bottom of source extension region 6-1. When nitrogen is implanted at a maximum voltage of 700 keV, for example, a depth of the implantation should be more than 0.8 μm. For a commonly used 400 keV implantation apparatus, divalent ions are used. After that, the mask is removed and activation annealing is conducted. Then, a SiO$_2$ film is deposited at the front surface of the wafer. Then, a resist mask is formed by photolithography for forming a mask pattern of SiO$_2$ film that is used to form trench 10. In the process of forming trench 10 in the case of FIG. 2, the depth of trench 10 needs to be properly controlled to achieve a desired breakdown voltage. In the case of FIG. 3, while trench 10 reaching field stopping layer 2 can impart the breakdown voltage theoretically, if trench 10 reaches SiC substrate 1, a problem may arise in reliability of embedded insulator 15 because SiC substrate 1 includes dislocations propagated in random directions from the bottom plane dislocations. The SiO$_2$ film is patterned using the formed resist mask, and then etching is carried out using the patterned SiO$_2$ film as a mask from the surface of source contact region 6 of the epitaxial SiC layer to form trench 10. When embedded p-type region 8 is provided at the bottom of trench 10 as shown in FIG. 2, ion implantation and activation annealing are carried out after properly protecting the side wall of the trench. It is favorable to implement a heat treatment for improving trench configuration for the purpose of eliminating acute angle configuration in the trench since an activation annealing is simultaneously performed in the heat treatment. When trench 10 is formed reaching field stopping layer 2 as shown in FIG. 3, embedded insulator 15 is formed. In this case too, the heat treatment for improving trench configuration preferably precede the process of forming embedded insulator 15 for the purpose of eliminating the irregularities on the side wall of trench 10 generated in the photolithography process.

Then, a SiO$_2$ film is deposited in a condition of proper adhesion to the side wall of trench 10 for example, by the so called HTO method (the high temperature oxide method) as employed in a silicon process, followed by heat treatment of the wafer for a predetermined time in a proper atmosphere for example, in N$_2$O atmosphere diluted by N$_2$ at 1,300° C., to form gate oxide film 11 with a predetermined thickness. This film thickness is determined according to a gate driving voltage and a driving electric field strength, and can be 50 nm, for example. The preceding deposition of the SiO$_2$ film excludes the fear of disappearance of the ion implantation layer due to accelerated oxidation, as compared with simple thermal oxidation to aim at a predetermined film thickness. Subsequently, phosphorus-doped polycrystalline silicon is deposited to a predetermined thickness by means of a reduced-pressure CVD method as in a silicon process to fill trench 10. After annealing for activation of the phosphorus and appropriate protection to leave a pad region (not depicted in FIGS. 1 through 3), the phosphorus-doped polycrystalline silicon is etched in a required pattern to form gate electrode 12. Subsequently, deposition of PSG (phosphosilicate glass) and reflowing are conducted to form an interlayer insulation film, and a contact hole for a source electrode is formed in the PSG. After that, metallic nickel and titanium are deposited on the front surface followed by patterning. Subsequently, while protecting the front surface with a resist, deposited substances on the back surface are removed and the wafer is immersed in buffered fluoric acid to eliminate the oxide film on the back surface as in a silicon process (though the order of the processing is much different). Metallic nickel and titanium are deposited on the back surface and patterned as necessary. After removing the resist on the front surface, heat treatment is implemented at 1,000° C. in an atmosphere of argon, for example, to attain ohmic contact between SiC and nickel and between SiC and titanium. As in a silicon process, a contact hole for a gate pad (not shown in FIGS. 1 through 3) is formed on the PSG, and aluminum is deposited on the front surface by sputtering followed by patterning. As required, additional heat treatment is conducted, to complete a device. The fabricated device has achieved the designed breakdown voltage of 1.2 kV.

A device was fabricated for comparison in which the bottom of body contact region 7 was positioned at the same level as the bottom of source extension region 6-1. A location on the wafer surface of the device was found with an extremely degraded yield in respect of breakdown voltage. The doping amount (impurity concentration) in body region 5 was measured, detecting a location with a lowered doping amount (impurity concentration) due to nonhomogeneity of distribution of doping in the surface. It was found in this location by calculation that a depletion layer approached the bottom of body contact region 7 that was formed more deeply than usual as mentioned previously. It is possible to suppose that since leak defects are induced in the tail part under body contact region 7, even if the depletion layer is not in touch with body contact region 7 according to calculation, the depletion layer actually is in touch with the tail part under body contact region 7 and came into contact with leak defects left in the tail part. The present invention intentionally forms a source extension region with a lowered doping amount under the source contact region. Therefore, despite high dose ion implantation required for forming a surface layer with such a high impurity concentration as to achieve a good ohmic contact, the device of the invention is hardly affected by the phenomenon that the efficiency percentage in respect of breakdown voltage is degraded due to high dose ion implantation.

Thus, a silicon carbide MOS semiconductor device has been described according to the present invention. Many modifications and variations may be made to the techniques and structures described and illustrated herein without departing from the spirit and scope of the invention. Accordingly, it should be understood that the methods and devices described herein are illustrative only and are not limiting upon the scope of the invention.

This application is based on and claims priority to Japanese Patent Application 2008-075281, filed on Mar. 24, 2008. The disclosure of the priority application in its entirety, including the drawings, claims, and the specification thereof, is incorporated herein by reference.

DESCRIPTION OF SYMBOLS

1: SiC substrate
2: field stopping layer
3: voltage blocking layer, drift layer
4: current spreading layer
5: body region
6: source contact region
6-1 source extension region
7: body contact region
8: embedded p-type region
10: trench
11: gate oxide
12: agate electrode
13: channel
15: embedded insulator
21: interlayer insulator
22: drain electrode
23: source electrode
224: anode electrode
229: surface protection film

What is claimed is:

1. A silicon carbide MOS semiconductor device comprising:
  a silicon carbide semiconductor substrate;
  a voltage blocking layer of a first conductivity type on a principal plane of the substrate;
  a body region of a second conductivity type on the voltage blocking layer:
  a body contact region in a surface region of the body region, the body contact region having impurity ions implanted therein and being of the second conductivity;
  a source contact region in a surface region of the body region, the source contact region having impurity ions implanted therein and being of the first conductivity type, the source contact region having an impurity concentration of $3 \times 10^{19}$ cm$^-$or higher and a thickness of from 0.3 μm to 0.4 μm, and having a tail part in a bottom region of the source contact region with a depth deeper than the depth of ion implantation in the source contact region;
  an electrode contacting the body contact region and the source contact region, wherein the surface impurity concentration of the body contact region and that of the source contact region are sufficient to cause an ohmic contact with the electrode;
  a source extension region under the source contact region at a region deeper than the tail part of the doping in the bottom region of the source contact region, the source extension region having impurity ions implanted therein with an impurity concentration of less than $3\times10^{19}$ cm$^-$, which concentration is lower than that in the source contact region and a depth of the source extension region being within 1 μm from the surface of the source contact region, and being formed under the tail part by selective ion implantation; and a trench formed from a top surface of the source contact region and passing through the source contact region, the source extension region, and the body region, and a gate electrode embedded in the trench on an internal surface thereof via an insulation film, an upper end of the embedded gate electrode being above the lower end of the source contact region, wherein the source contact region and the voltage blocking layer are separated from each other by the body region.

2. The silicon carbide MOS semiconductor device according to claim 1, wherein an impurity concentration and a thickness of the body contact region are either such that a depletion layer extending from an interface between the voltage-blocking layer and the body region, reaches an avalanche breakdown voltage when a reverse bias voltage is applied to a pn junction between the voltage blocking layer and the body region before the depletion layer comes in contact with a defect region generated by implantation damage in the tail part at the bottom region of the body contact region, or such that the depletion layer undergoes punch-through by touching the source extension region before the depletion layer comes in contact with a defect region generated by implantation damage in the tail part at the bottom region of the body contact region.

3. The silicon carbide MOS semiconductor device according to claim 1, wherein the impurity concentration of the source extension region is not greater than $5\times10^{18}$ cm$^-$.

4. The silicon carbide MOS semiconductor device according to claim 1, wherein the type of ions implanted in the source extension region has a mass ratio to silicon smaller than that of the type of ions implanted in the source contact region.

5. The silicon carbide MOS semiconductor device according to claim 1, wherein the mass number of the type of ions implanted in the source extension region is 18 or less.

6. The silicon carbide MOS semiconductor device according to claim 1, wherein the first conductivity type is an n-type, and the type of ions implanted in the source contact region is mainly phosphorus and the type of ions implanted in the source extension region is mainly nitrogen.

7. The silicon carbide MOS semiconductor device according to claim 1, wherein the first conductivity type is a p-type, and the type of ions implanted in the source contact region is mainly aluminum and the type of ions implanted in the source extension region is mainly boron.

8. The silicon carbide MOS semiconductor device according to claim 1, wherein the crystal form of the silicon carbide semiconductor is the hexagonal crystal form.

9. The silicon carbide MOS semiconductor device according to claim 1, wherein a major principal plane of the silicon carbide semiconductor substrate is a {0001} plane.

\* \* \* \* \*